(12) United States Patent
Tanaka et al.

(10) Patent No.: US 7,674,114 B2
(45) Date of Patent: Mar. 9, 2010

(54) BOARD-TO-BOARD CONNECTOR

(75) Inventors: Hirohisa Tanaka, Tsu (JP); Shunsuke Hashimoto, Tsu (JP)

(73) Assignee: Panasonic Electric Works Co., Ltd., Osaka (JP)

( * ) Notice: Subject to any disclaimer, the term of this patent is extended or adjusted under 35 U.S.C. 154(b) by 150 days.

(21) Appl. No.: 11/909,651

(22) PCT Filed: Jan. 26, 2007

(86) PCT No.: PCT/JP2007/051284

§ 371 (c)(1),
(2), (4) Date: Sep. 25, 2007

(87) PCT Pub. No.: WO2007/086516

PCT Pub. Date: Aug. 2, 2007

(65) Prior Publication Data

US 2009/0061656 A1    Mar. 5, 2009

(30) Foreign Application Priority Data

Jan. 26, 2006    (JP)    .............................. 2006-018293

(51) Int. Cl.
*H01R 12/00*    (2006.01)
(52) U.S. Cl. ...................................... 439/74
(58) Field of Classification Search ................... 439/74, 439/75, 68, 69, 70, 285, 516, 82, 943, 290, 439/284, 931, 73
See application file for complete search history.

(56) References Cited

U.S. PATENT DOCUMENTS

| | | | | |
|---|---|---|---|---|
| 5,411,400 | A * | 5/1995 | Subrahmanyan et al. | ...... 439/68 |
| 5,460,531 | A * | 10/1995 | Vivio | ........................... 439/70 |
| 5,938,455 | A * | 8/1999 | Glovatsky et al. | .............. 439/74 |
| 6,658,731 | B1 * | 12/2003 | Goenka et al. | ................. 29/846 |
| 7,083,446 | B2 | 8/2006 | Tanaka et al. | |

(Continued)

FOREIGN PATENT DOCUMENTS

DE    19840501    4/2000

(Continued)

OTHER PUBLICATIONS

English Language Abstract of JP 52-73395.

(Continued)

*Primary Examiner*—Edwin A. Leon
(74) *Attorney, Agent, or Firm*—Greenblum & Bernstein, P.L.C.

(57) ABSTRACT

A thin board-to-board connector with high density in which there is no connection between three-dimensional complex metal springs. The board-to-board connector includes a connector having a bump for electrical connection having an umbrella shape on a board and connected to a circuit board and a connector having an elastic electrically conductive section having a through hole made in a conductive pattern on an elastic insulating board and connected to a circuit board electrically connected to the elastic conductive section. When a bump is inserted into the through hole, the elastic conductive section is electrically connected to the bump, and the side surface of the through hole is pressed against to the bump and elastically deformed and dented. Consequently, the bump is press-fit into the through hole. With this, the bump can be inserted into the elastic conductive section and engaged with it, and thereby electrical and mechanical connection between circuit boards can be simultaneously achieved in a two-dimensional manner, realizing a low-height connector.

5 Claims, 17 Drawing Sheets

U.S. PATENT DOCUMENTS

| | | |
|---|---|---|
| 7,112,091 B2 | 9/2006 | Okura et al. |
| 7,210,950 B2 | 5/2007 | Tanaka et |
| 2007/0161274 A1 | 7/2007 | Tanaka et al. |

FOREIGN PATENT DOCUMENTS

| | | |
|---|---|---|
| JP | 52 73395 | 6/1977 |
| JP | 2000 114434 | 4/2000 |
| JP | 2004 55464 | 2/2004 |
| JP | 2004 95447 | 3/2004 |
| JP | 2005 346995 | 12/2005 |
| JP | 2006 244762 | 9/2006 |

OTHER PUBLICATIONS

English Language Abstract of JP 2006-244762.
English Language Abstract of JP 2005-346995.
English Language Abstract of JP 2004-95447.
English Language Abstract of JP 2000-114434.
English Language Abstract of JP 2004-55464.
English language Abstract of DE 19840501, Apr. 20, 2000.

\* cited by examiner

[Fig.8]
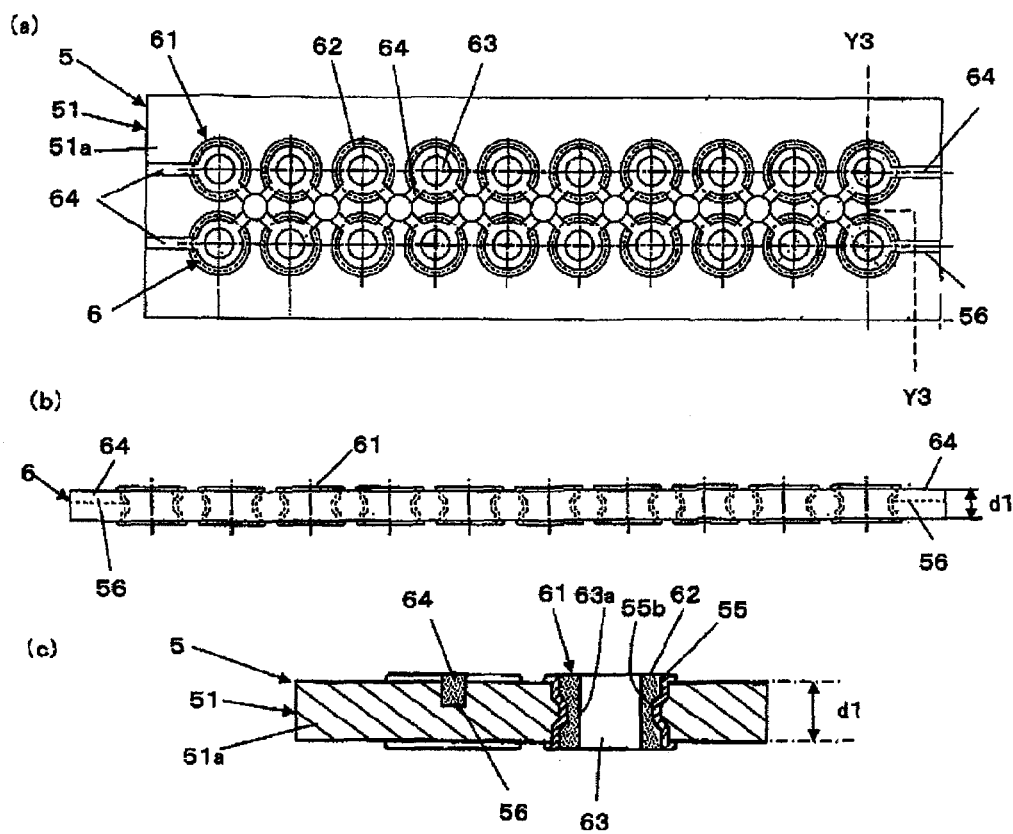
Fig.9
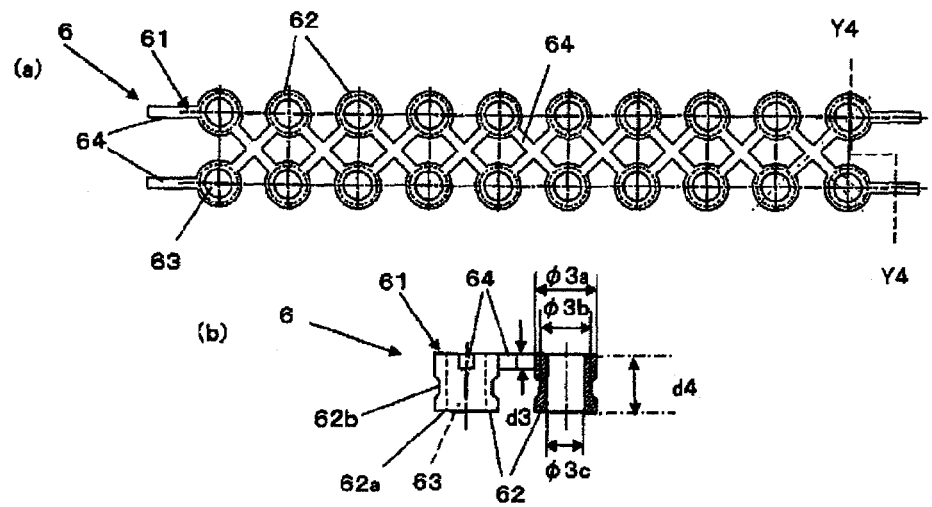

BOARD-TO-BOARD CONNECTOR

TECHNICAL FIELD

The present invention relates to a board-to-board connector used in a compact and slim electronic devices.

BACKGROUND ART

The board-to-board connector for connecting electronic circuits on two opposed printed circuit boards to each other is used as a connector used in electronic devices such as mobile phones and digital cameras which have been reduced in size and weight. In the board-to-board connector, one of the connected printed circuit board has a socket and the other of the connected printed circuit board has a header. By connecting the socket to the header, electronic circuits formed on both the printed circuit boards are connected to each other.

In this type of conventional board-to-board connector, as disclosed in, for example, Unexamined Patent Publication No. 2004-055464, a contact obtained by bending a strip conductor in the shape of a dead end is provided at the socket as one connector, and a post having a conductor protruding from the header as the other connector is inserted into and engaged with the dead end portion of the contact, thereby bringing the inner side surface of the dead end portion of the contact into spring contact with the outer side surface of the post for electrical connection.

However, from the perspective of further reduction in size and thickness, since the connector disclosed in the above-mentioned Patent document 1 has the structure that the inner side surface of the dead end portion of the contact is brought into contact with the outer side surface of the post for electrical connection, when one attempts to make the structure thinner, bending of the contact becomes difficult. In addition, when the contact portion is shortened, sufficient contact area is hard to be ensured and binding strength between the contact and the post due to engagement is decreased. Thus, disadvantageously, the engagement is easy to be released.

For narrower pitch and higher density, it is necessary to narrow the pitch of the contact and the post which are fixed to a housing of the connector as well as their press-fit grooves. However, since the housing, into where the contact and the post are press-fit, is made of synthetic resin, there is a limitation in reducing the size of the housing due to workability and strength, making it more difficult to reduce the pitch. Furthermore, since minimum thickness of the housing is needed to stand press-fitting of the contact and the post, it is difficult to reduce the height of the connector.

As described above, the conventional board-to-board connector is formed of moldings and metallic components and both electronic and mechanical connection is performed by elastically deforming mechanically-processed metallic springs having complicated and three-dimensional structure. Thus, obviously, there is a limitation in lower height (thinner size) and higher density.

DISCLOSURE OF INVENTION

To solve the above-mentioned problems, an object of the present invention is to provide a board-to-board connector which can perform simultaneous electrical and mechanical connection and achieve reduction in thickness as compared to conventional board-to-board connectors by eliminating connection between three-dimensional and complicated metal springs.

To achieve the object, the present invention provides a board-to-board connector for connecting circuit boards to each other comprising: a first connector attached to one circuit board; and a second connector attached to the other circuit board, wherein the first connector includes an umbrella-like conductive bump electrically connected to a circuit of the one circuit board, the second connector includes a conductive pattern electrically connected to the other circuit board and an elastic body which is electrically connected to the conductive pattern and has an insertion hole capable of inserting the bump thereinto, and by inserting the bump into the insertion hole of the elastic body, both the circuit boards are electrically and mechanically connected to each other.

Since electrical and mechanical connection between the circuit boards can be performed in a two-dimensional way by using two components of the bump and the elastic body, it is unnecessary to use a three dimensional spring which requires space, achieving lower height and higher density. Furthermore, since electrical connection is performed by inserting the insertion hole of the elastic body and bringing the bump and the elastic body into contact with each other, an elastic effect is applied to the contact portion at attachment/detachment of the bump to/from the elastic body. Thus, when the bump is inserted, the umbrella section of the bump is caught in and engaged with the insertion hole of the elastic body, the bump can be prevented from slipping off the elastic body. Moreover, since this insertion hole is electrically connected to the conductive pattern, even when the bump is caught in any position in the insertion hole, electrical connection between the insertion hole and the bump can be maintained.

According to the present invention, in the improved board-to-board connector, the elastic body is formed of a substrate with circuit and a conductive rubber filled into a groove and a through hole which are formed on the substrate with circuit to be integrally molded, and the conductive pattern is formed of a circuit of the substrate and the conductive rubber. Thus, since the conductive rubber becomes the conductive pattern and is electrically connected to the bump, there is no need to form a circuit pattern for contact against the bump by means of plating or the like, resulting in simple manufacturing processes. Moreover, since the through hole is made of the conductive rubber, compared with the case the bump is inserted into the through hole made of a copper foil, there is less possibility that the conductive pattern is chipped or peeled off due to insertion of the umbrella section of the bump into the through hole. Furthermore, the through hole can be configured using the conductive rubber only at the area of the substrate with circuit into which the bump is inserted. Thus, since the whole of the substrate with circuit 51a need not be elastic, an inexpensive circuit board can be used, resulting in lower costs.

According to the present invention, in the improved board-to-board connector, the elastic body is formed of a substrate with circuit and a conductive rubber integrally molded on the substrate with circuit and in a through hole formed on the substrate, and the conductive pattern is formed of a circuit of the substrate and the conductive rubber. Thus, since the conductive pattern is integrally formed on the substrate and in the through hole without forming a groove on the circuit board, manufacturing processes become simple, leading to reduction in manufacturing costs. Further, groove processing of further decreasing the intensity of the thin substrate having low intensity is not carried out, the intensity of the connector can be prevented from lowering.

According to the present invention, in the improved board-to-board connector, the elastic body is formed of a insulative substrate with circuit and a conductive rubber sheet which is joined to the substrate and on which a hole for inserting the bump thereinto is formed, and the conductive pattern is formed of a circuit of the substrate and the conductive rubber. Thus, since the conductive rubber and the substrate are not integrally molded and the independent conductive rubber sheet 6a is used, expensive facilities and complicated techniques for integral molding are unnecessary.

According to the present invention, in the improved board-to-board connector, the conductive rubber sheet has a copper foil and the copper foil is joined to a joining pattern provided on the insulative substrate with circuit. Thus, since the conductive rubber sheet has the copper foil, the copper foil can be joined to the insulative substrate with circuit. By removing an unnecessary portion from the rubber sheet with copper foil by mechanical processing with the copper foil being stuck, joining the molded rubber sheet with copper foil to the insulative substrate with circuit through the copper foil and then, mechanically removing the unnecessary portion again, the conductive rubber sheet can be easily processed and formed on the substrate.

BRIEF DESCRIPTION OF DRAWINGS

FIG. 8(a) is a plan view of the second connector in the board-to-board connector.

FIG. 8(b) is a side view of FIG. 8(a).

FIG. 8(c) is a sectional view taken along Y3-Y3 in FIG. 8(a).

FIG. 9(a) is a plan view of a conductive rubber of the second connector.

FIG. 9(b) is a sectional view taken along Y4-Y4 in FIG. 9(a).

BEST MODE FOR CARRYING OUT THE INVENTION

Figure 1:
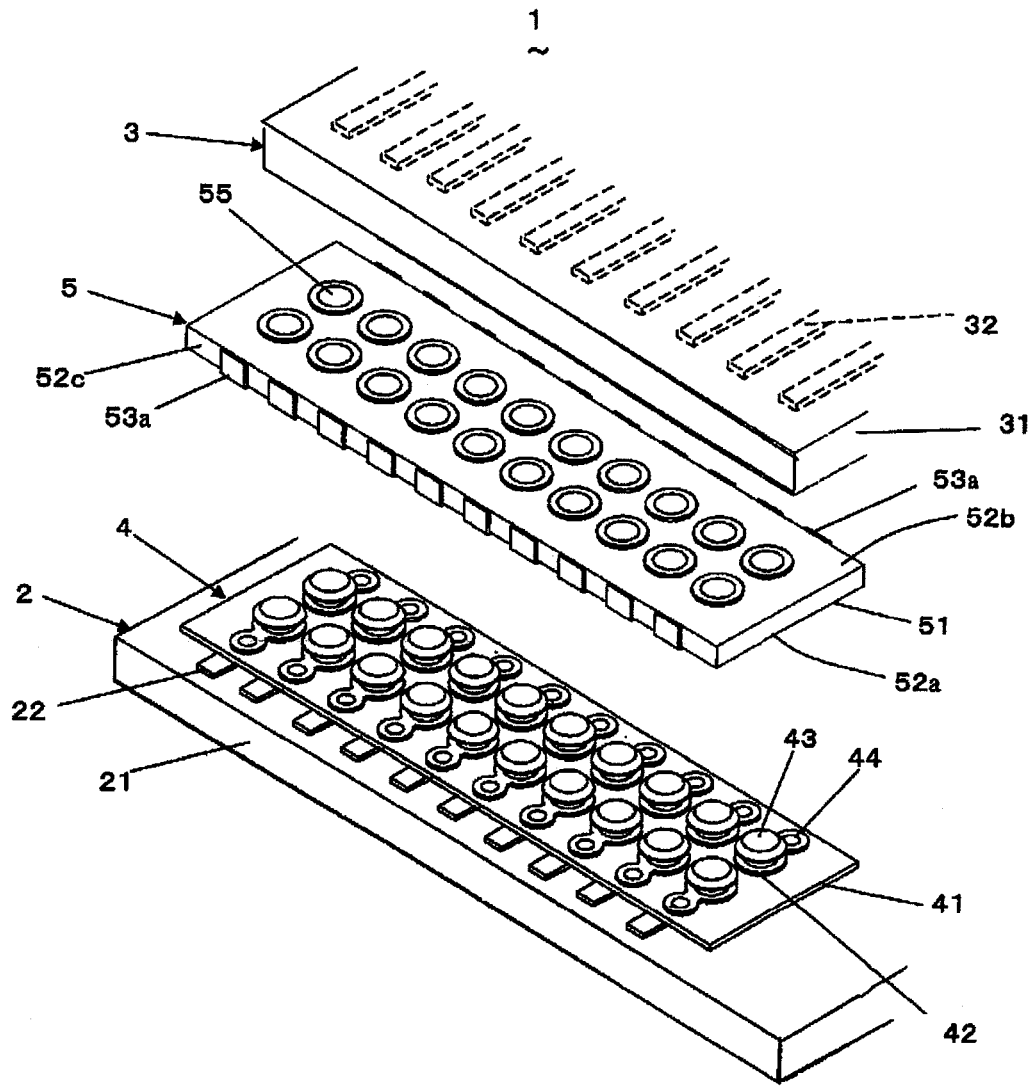
FIG. 1 is an exploded view of a board-to-board connector in accordance with First embodiment of the present invention.
Figure 2:
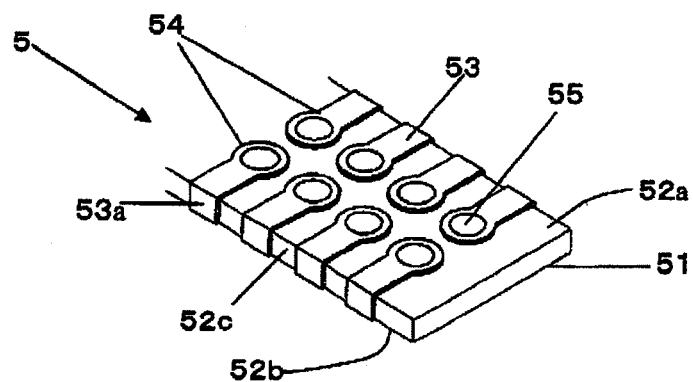
FIG. 2 is a partial perspective view of a second connector in the board-to-board connector when viewed from the direction of connecting the second connector to a first connector.

Hereinafter, a board-to-board connector in accordance with First embodiment of the present invention will be described with reference to FIG. 1 to FIG. 5. The board-to-board connector 1 in this embodiment has a first connector 4 and a second connector 5 for board-to-board connection, which are connected to circuit boards 2 and 3, respectively. The first connector 4 and the second connector 5 are electrically connected to a circuit pattern 22 formed on an insulative substrate 21 of the circuit board 2 and a circuit pattern 32 formed on an insulative substrate 31 of the circuit board 3, respectively. The board-to-board connector 1 connects the circuit boards 2, 3 by connecting the first connector 4 to the second connector 5.

As shown in FIG. 1, the first connector 4 has a substrate 41 made of an insulative member and a conductive pattern 42 provided on the surface of the substrate 41 (the upper surface in FIG. 1). On the conductive pattern 42 are provided a conductive bump 43 having an umbrella shape (so-called mushroom bump) and a through hole 44. By soldering the circuit pattern 22 of the circuit board 2 to the conductive pattern 42 of the substrate 41 through the through hole 44, the bump 43 is electrically connected to the circuit pattern 22 and the connector 4 is fixed to the circuit board 2.

Figure 3:
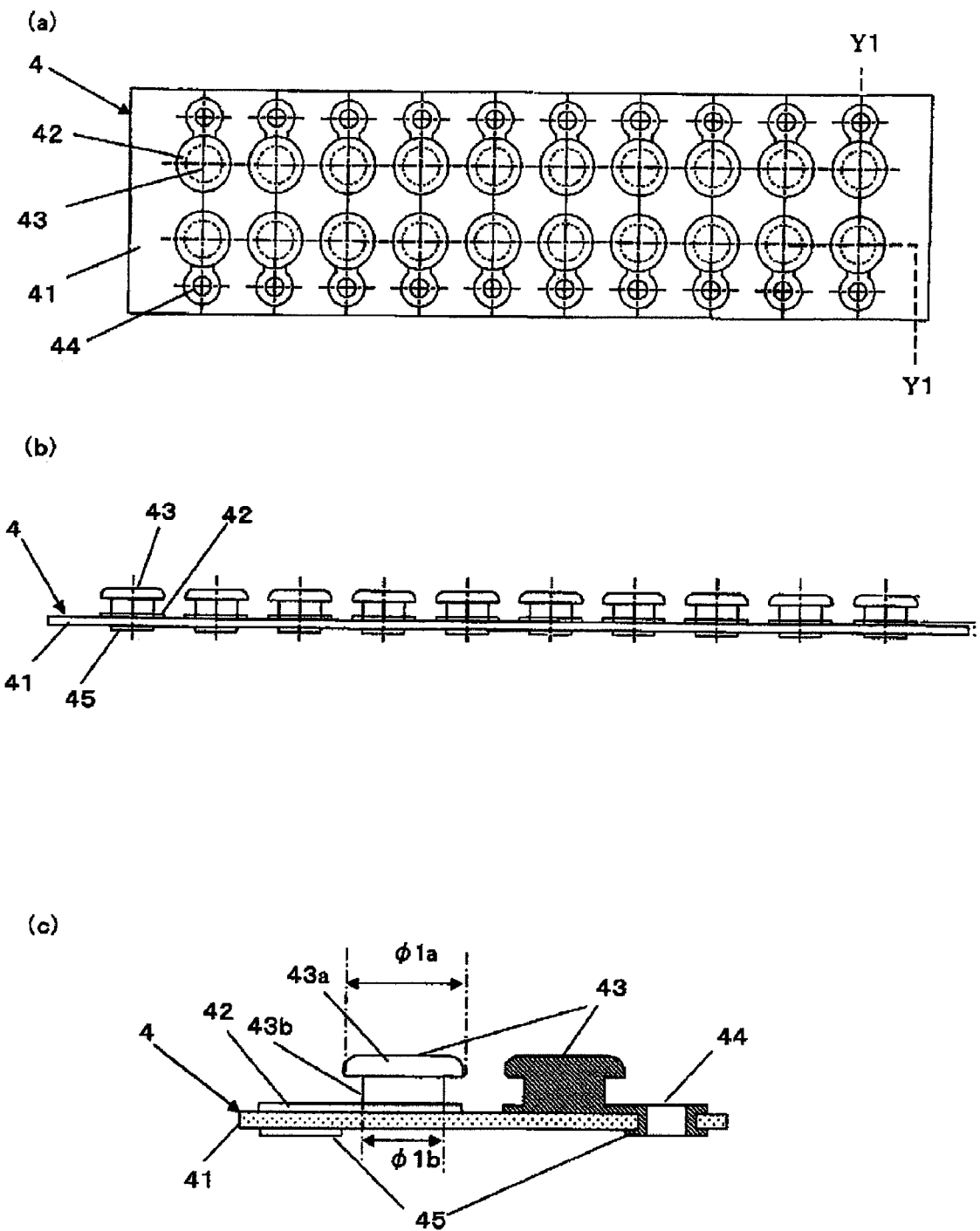
FIG. 3(a) is a plan view of the first connector in the board-to-board connector.
FIG. 3(b) is a side view of FIG. 3(a).
FIG. 3(c) is a sectional view taken along Y1-Y1 in FIG. 3(a).

As shown in FIG. 3, the bump 43 is made of a relatively hard conductive material such as metal, consists of a circular umbrella-like section 43a and a neck section 43b, and is formed on the substrate 41 integrally with the conductive pattern 42. The umbrella section 43a is substantially shaped like a disc having a diameter of $\phi 1a$ and the neck section 43b is shaped like a column having a diameter of $\phi 1b$. The bump 43 is inserted into an elastic conductive section 54 described below (refer to FIG. 4 (a)), on which the through hole 55 of the elastic substrate 51 of the connector 5 is formed, by the diameters of $\phi 1a$, $\phi 1b$ and height of the bump 43. The umbrella section 43a of the bump 43 is caught in the elastic conductive section 54 due to elastic pressure and locked in the elastic conductive section 54. The bumps 43 are separately disposed in parallel two lines in the longitudinal direction of the conductive patterns 42 on the substrate 41. Each bump 43 is integrally connected to the plurality of circuit patterns 22 on the circuit board 2 through a connection pattern 45 on the back surface of the bump. Arrangement of the bumps in plural lines enables the circuit boards to be connected to each other in the form of a matrix.

Figure 4:
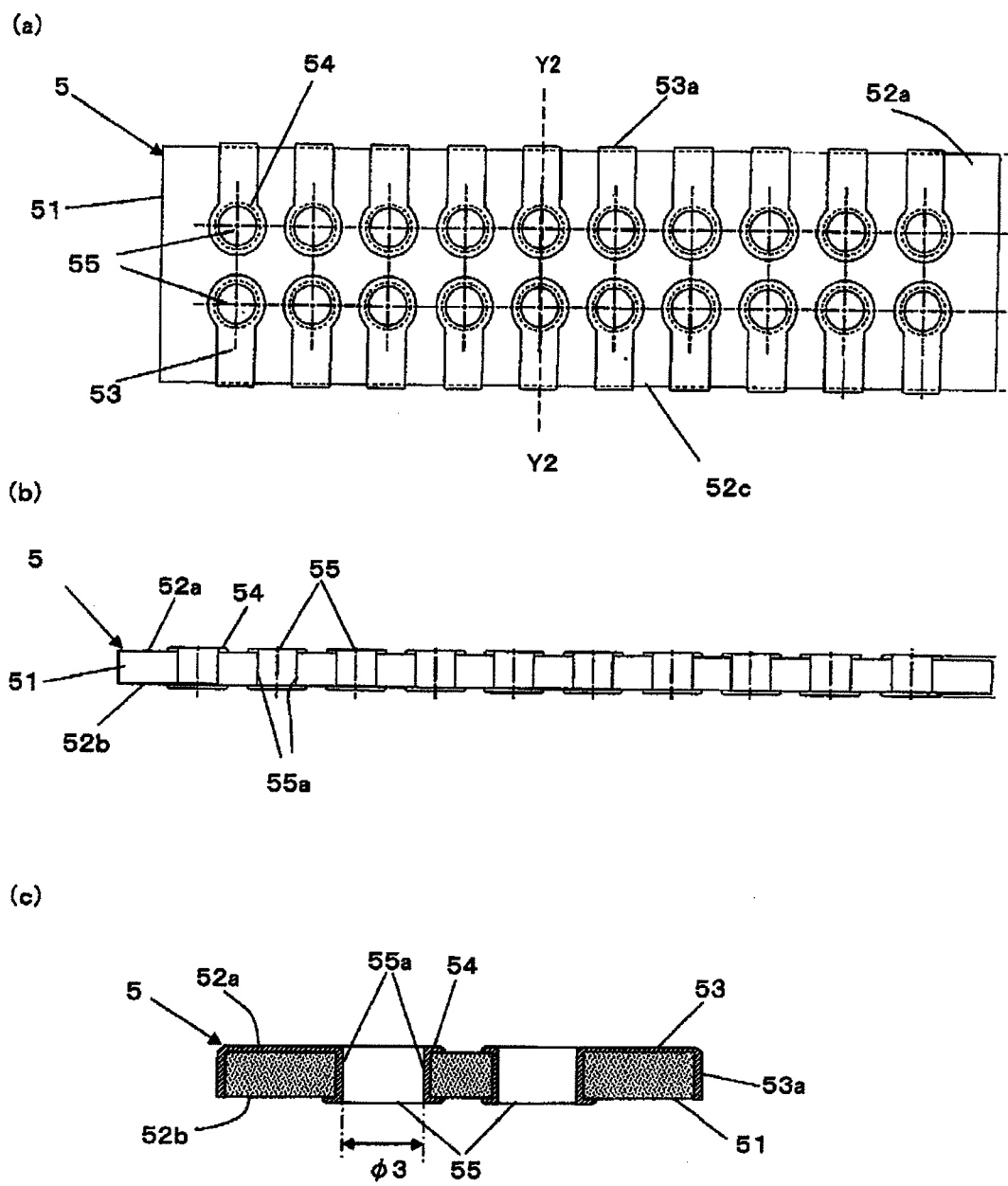
FIG. 4(a) is a plan view of the second connector in the board-to-board connector.
FIG. 4(b) is a side view of FIG. 4(a).
FIG. 4(c) is a sectional view taken along Y2-Y2 in FIG. 4(a).
Figure 5:
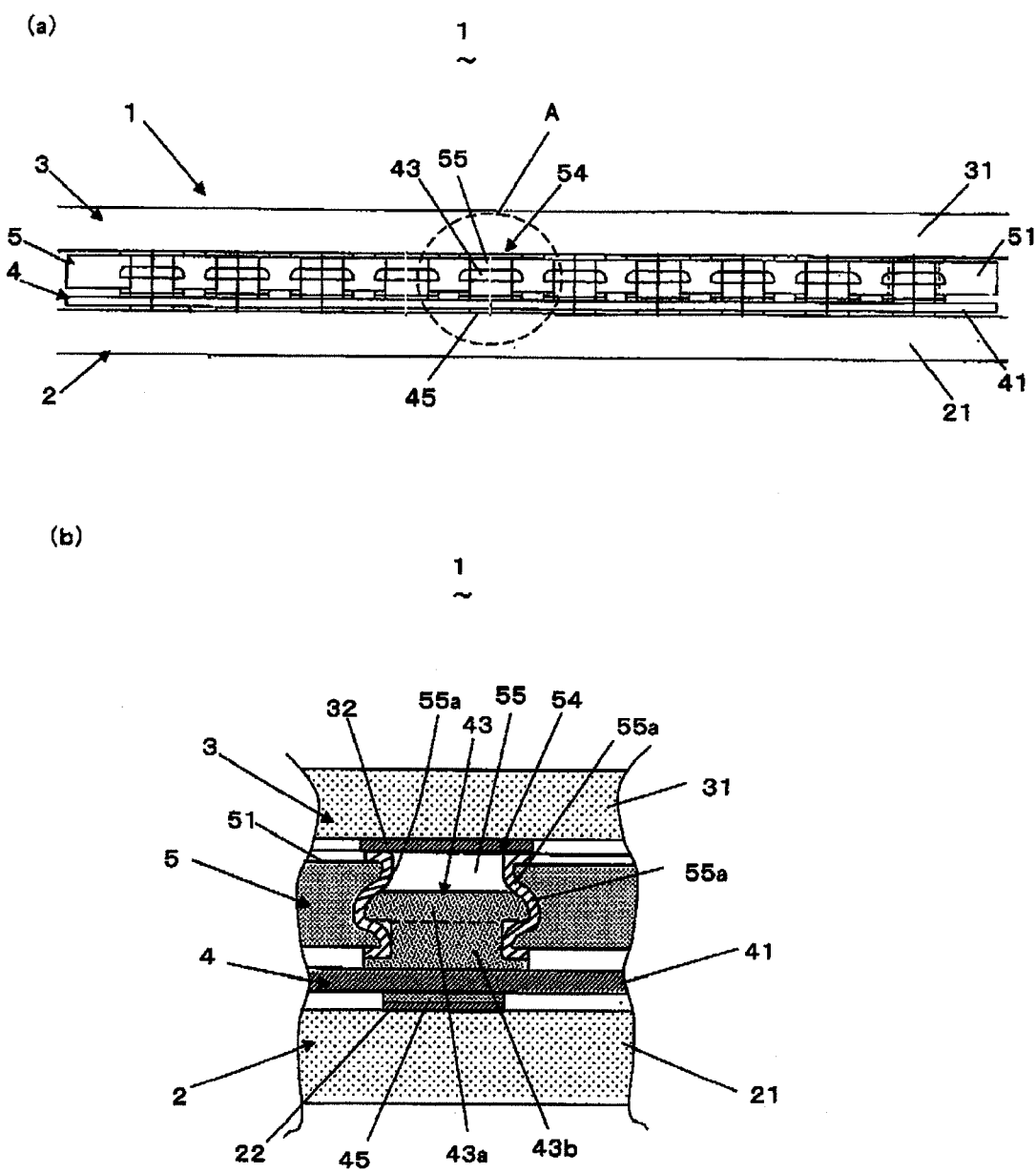
FIG. 5(a) is a sectional view showing connection state of the board-to-board connector.
FIG. 5(b) is an enlarged view of a part A in FIG. 5(a).
Figure 6:
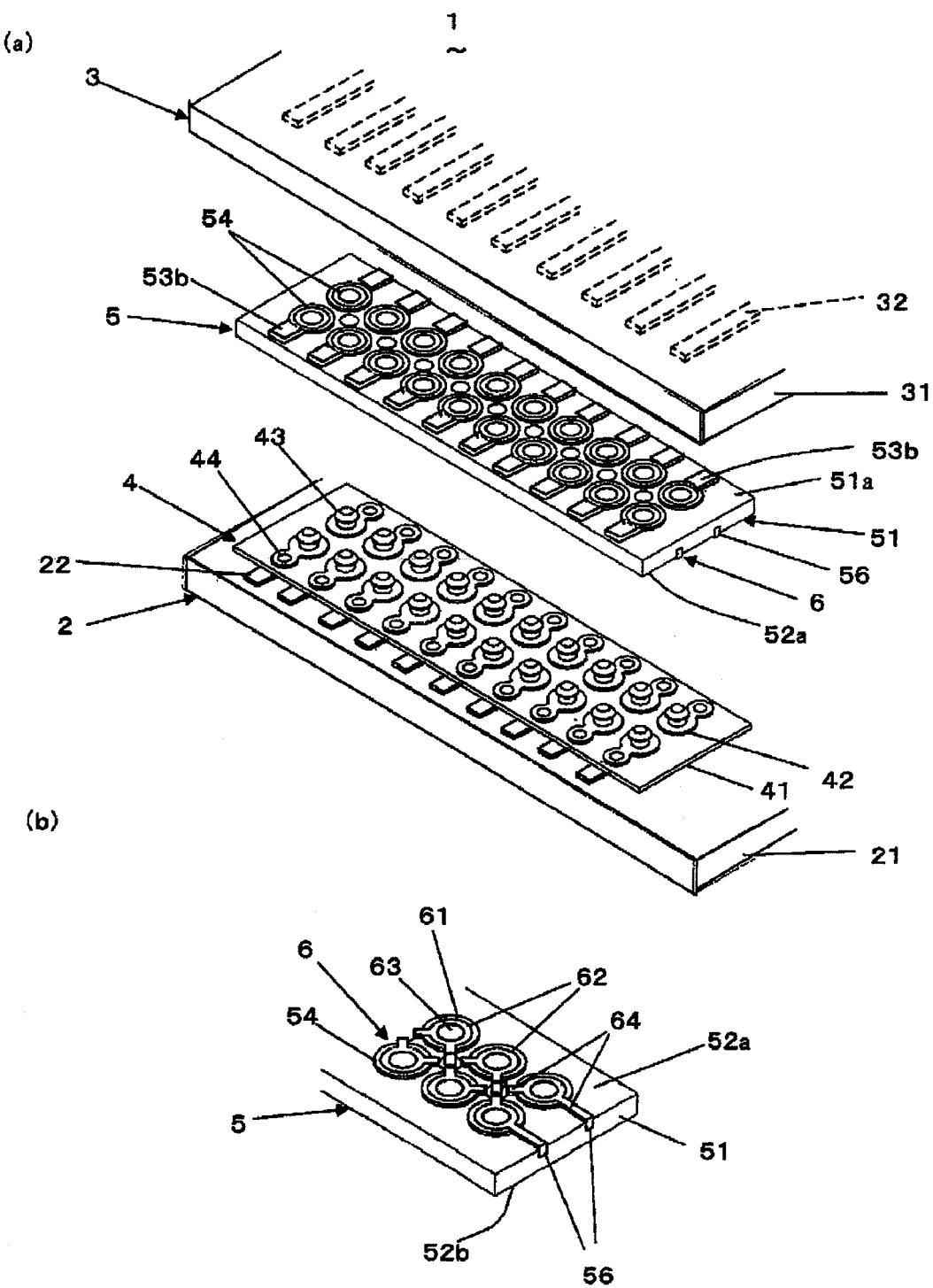
FIG. 6(a) is a sectional view of a board-to-board connector in accordance with Second embodiment of the present invention.
FIG. 6(b) is a partial perspective view of the second connector in the board-to-board connector when viewed from the direction of connecting the second connector to the first connector.

As shown in FIG. 4, the second connector 5 has the substrate 51 made of an elastic material (for example, a silicon rubber sheet). Conductive patterns 53, 53a are provided on a surface 52a (lower surface in FIG. 1) and a side surface 52c which is continuous to the surface 52a in the longitudinal direction of the substrate 51. The circular elastic conductive section 54 having the through hole 55 into which the bump 43 can be inserted is formed on the conductive pattern 53 on the surface 52a of the substrate 51. A diameter $\phi 3$ of the through hole 55 is set to be smaller than the diameter $\phi 1a$ of the umbrella section 43a of the bump 43 and be substantially equal to the diameter $\phi 1b$ of the neck section 43b of the bump 43. Each diameter of the umbrella section 43a and the neck section 43b is set so that, when the bump 43 is inserted into the elastic conductive section 54 formed of the through hole 55 for bump connection, an inner wall surface 55a of the elastic conductive section 54 may be radially expanded by the umbrella section 43a of the bump 43 due to insertion pressure of the rigid bump 43 to be elastically deformed, and the bump 43 may be press-fit into the wall surface 55a and thus be locked in the elastic conductive section 54.

At this time, the wall surface 55a made of a copper foil of the through hole 55 of the elastic conductive section 54 is made thin so as to have elasticity and be elastically deformed integrally with the elastic substrate 51. In this manner, the bump 43 and the elastic conductive section 54 are connected to and engaged with each other simultaneously, thereby achieving electrical and mechanical connection therebetween. Furthermore, by soldering the conductive pattern 53a of the side surface 52c to the circuit pattern 32 of the circuit board 3, the conductive pattern 53 is electrically connected to the circuit pattern 32 and the connector 5 is fixed to the circuit board 3.

The first circuit board 2 and the second circuit board 3 are connected to the first connector 4 and the second connector 5, respectively. In this state, the bump 43 formed on the conductive pattern 42 of the first connector 4 is pressingly inserted into and contacts against the through hole 55 formed on the conductive pattern 53 of the second connector 5. The circuit pattern 22 of the first circuit board 2 is electrically connected to the circuit pattern 32 of the second circuit board 3 through the contact portion.

Next, the circuit boards 2, 3 in the case where the bump 43 is inserted into the elastic conductive section 54 will be described with reference to FIGS. 5(a), (b). As described above, the first connector 4 having the bump 43 is fixed to the circuit board 2 so as to be electrically connected to the circuit pattern 22 of the circuit board 2 through the connection pattern 45 on the back surface side of the bump 43. The second connector 5 having the elastic conductive section 54 is fixed to the circuit board 3 in the state where the elastic conductive section 54 is electrically connected to the circuit pattern 32 of the circuit board 3.

The connector 4 is connected to the connector 5 by inserting the bump 43 into the elastic conductive section 54. When the bump 43 is inserted into the elastic conductive section 54, the umbrella section 43a of the bump 43 is inserted up to substantially the middle of the substrate 51 in the thickness direction, and the contact portion between the umbrella section 43a and the wall surface 55a of the through hole 55 of the elastic conductive section 54 is expanded in the radial direction. As a result, the substrate 51 is elastically deformed and dented. Since a diameter $\phi 1b$ of the neck section 43b of the bump 43 is almost equal to the diameter $\phi 3$ of the through hole 55 of the elastic conductive section 54, the inner side surface of the through hole 55 is not subject to pressure and hardly deformed. The bump 43 is press-fit into and engaged with the elastic conductive section 54, thereby connecting the connector 4 to the connector 5. Thus, the circuit boards 2, 3 are electrically and mechanically connected to each other.

In this embodiment thus constituted, two components of the connector 4 as the substrate with bumps and the connector 5 as the substrate with elastic insertion holes contact against and are engaged with each other. Thus, the total height becomes lower by inserting the bump 43 into the substrate 51. Furthermore, electrical and mechanical connection can be achieved without using a conventional three-dimensional spring requiring large space as well as a housing with a thickness for inserting the spring thereinto, resulting in a low-height and high-density connector.

By using the elastic substrate 51 of the connector 5 connected to the bump 43 of the connector 4, a hole for inserting the bump 43 thereinto, that is, the through hole 55 can be provided on the substrate 51 to form the elastic conductive section 54 having the through hole 55. Thus, the bump 43 can be directly inserted into the substrate 51, thereby achieving simple connection. Further, since the umbrella section 43a of the bump 43 is press-fit into and engaged with the elastic conductive section 54, the bump 43 is hard to be detached. Furthermore, since the through hole 55 is formed on the elastic conductive section 54, even when the bump 43 is engaged with any position on the copper foil of the through hole 55, electrical connection can be maintained.

Next, a board-to-board connector in accordance with Second embodiment of the present invention will be described with reference to FIG. 6 to FIG. 10. The board-to-board connector 1 in this embodiment has the same basic structure as the board-to-board connector in First embodiment. In the second connector 5, the elastic substrate 51 (elastic body) is formed of a substrate with circuit 51a and a conductive rubber 6 which is filled in a groove 56 and the through hole 55 formed on the substrate with circuit 51a to be integrally molded. The conductive pattern is formed of the circuit of the substrate 51a and the conductive rubber 6. Since the first connector 4 in this embodiment is the same as the connector 4 in First embodiment, drawings and detailed description thereof are omitted.

The second connector 5 has the elastic substrate 51 and as shown in FIG. 8, the elastic substrate 51 has the substrate 51a as an insulative substrate with circuit and the conductive rubber 6. A through hole and a groove are formed on the substrate 51a, and the through hole 55 and the gate groove 56 thus formed are filled with the conductive rubber 6 to be integrally molded. Thus, the conductive pattern of the elastic substrate 51 is formed of the circuit of the substrate 51a and the conductive rubber 6.

Figure 7:
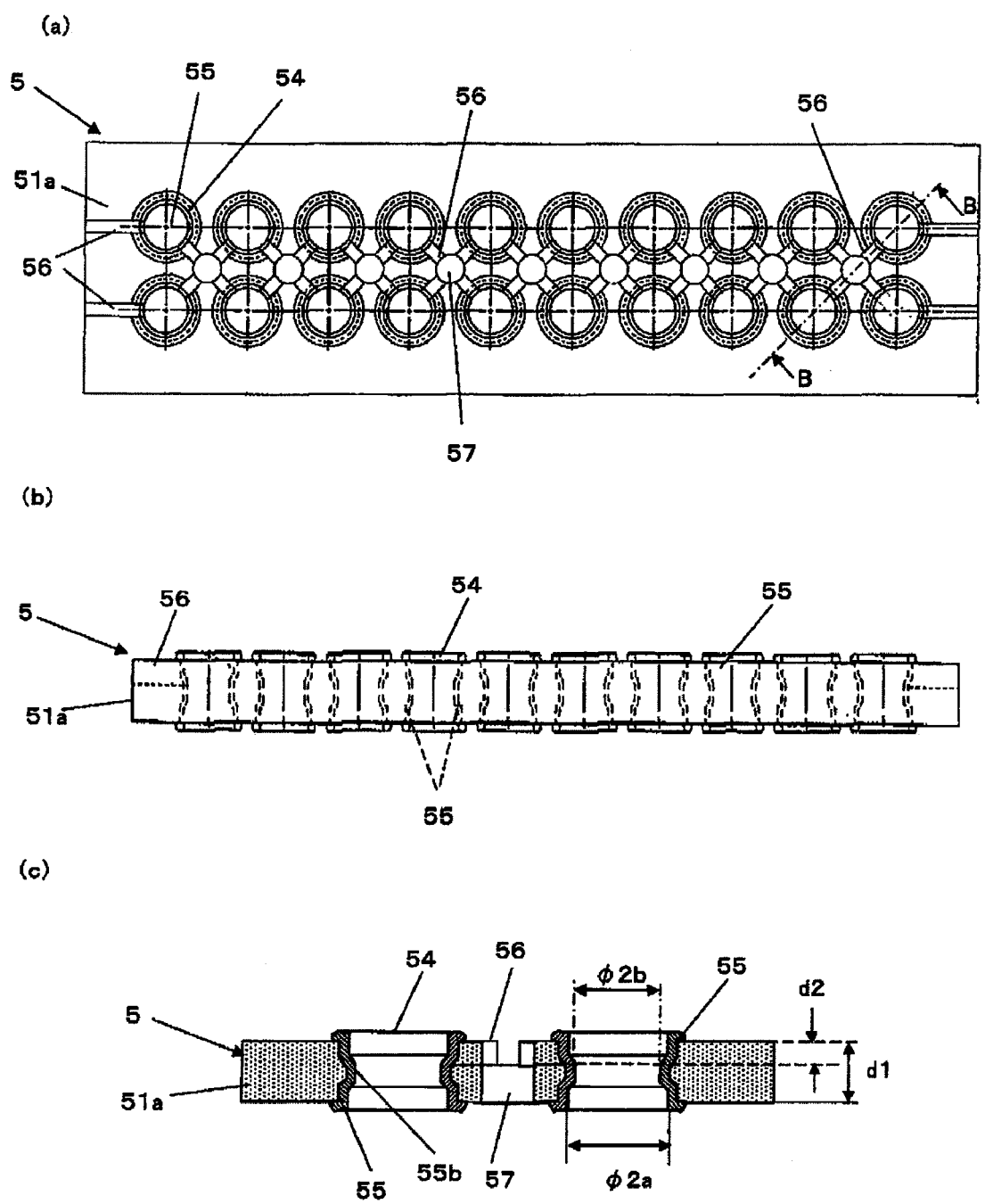
FIG. 7(a) is a plan view of the first connector in the board-to-board connector.
FIG. 7(b) is a side view of FIG. 7(a).
FIG. 7(c) is a sectional view taken along B-B in FIG. 7(a).
Figure 10:
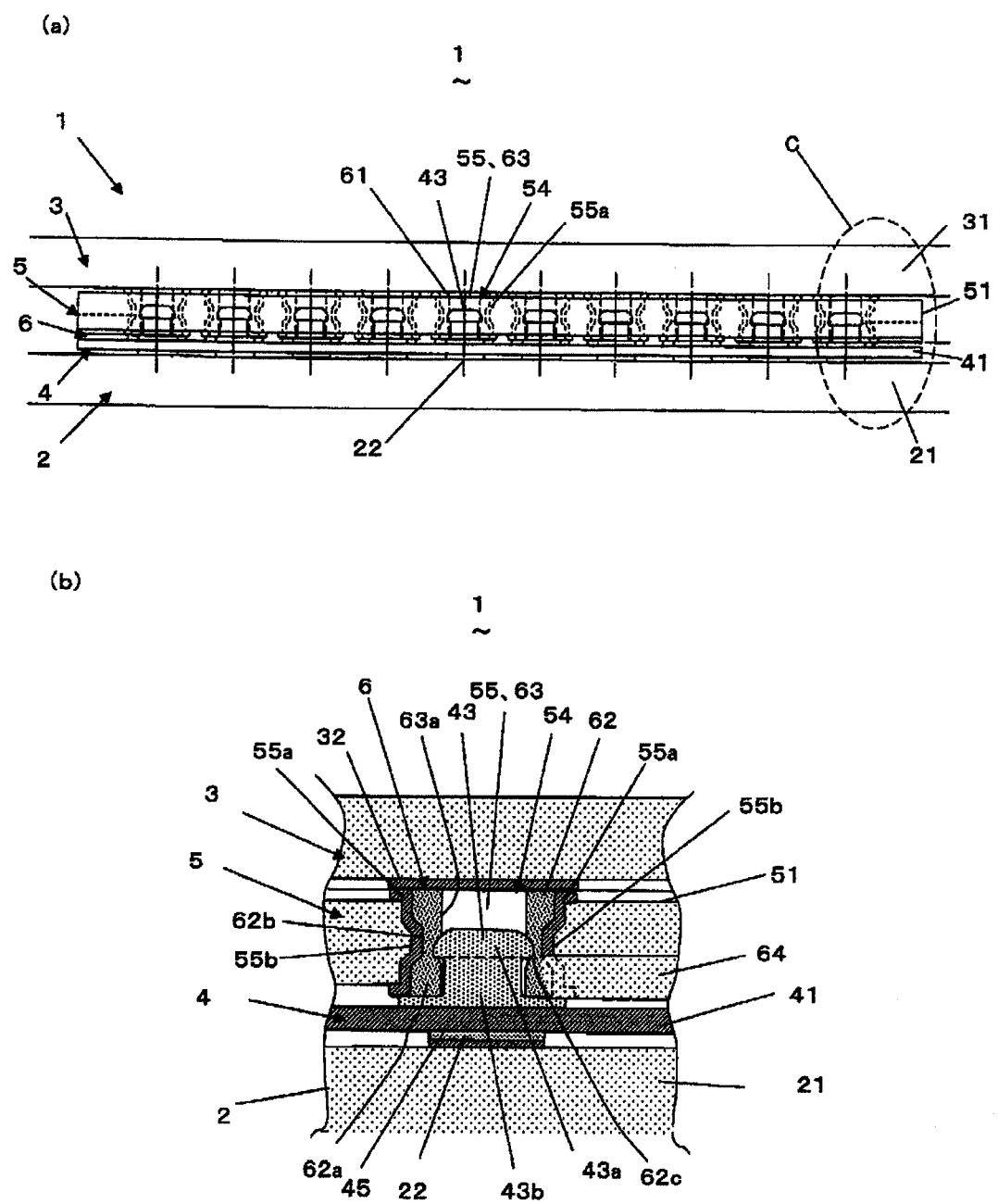
FIG. 10(a) is a sectional view showing connection state of the board-to-board connector.
FIG. 10(b) is an enlarged view of a part C in FIG. 10(a).
Figure 11:
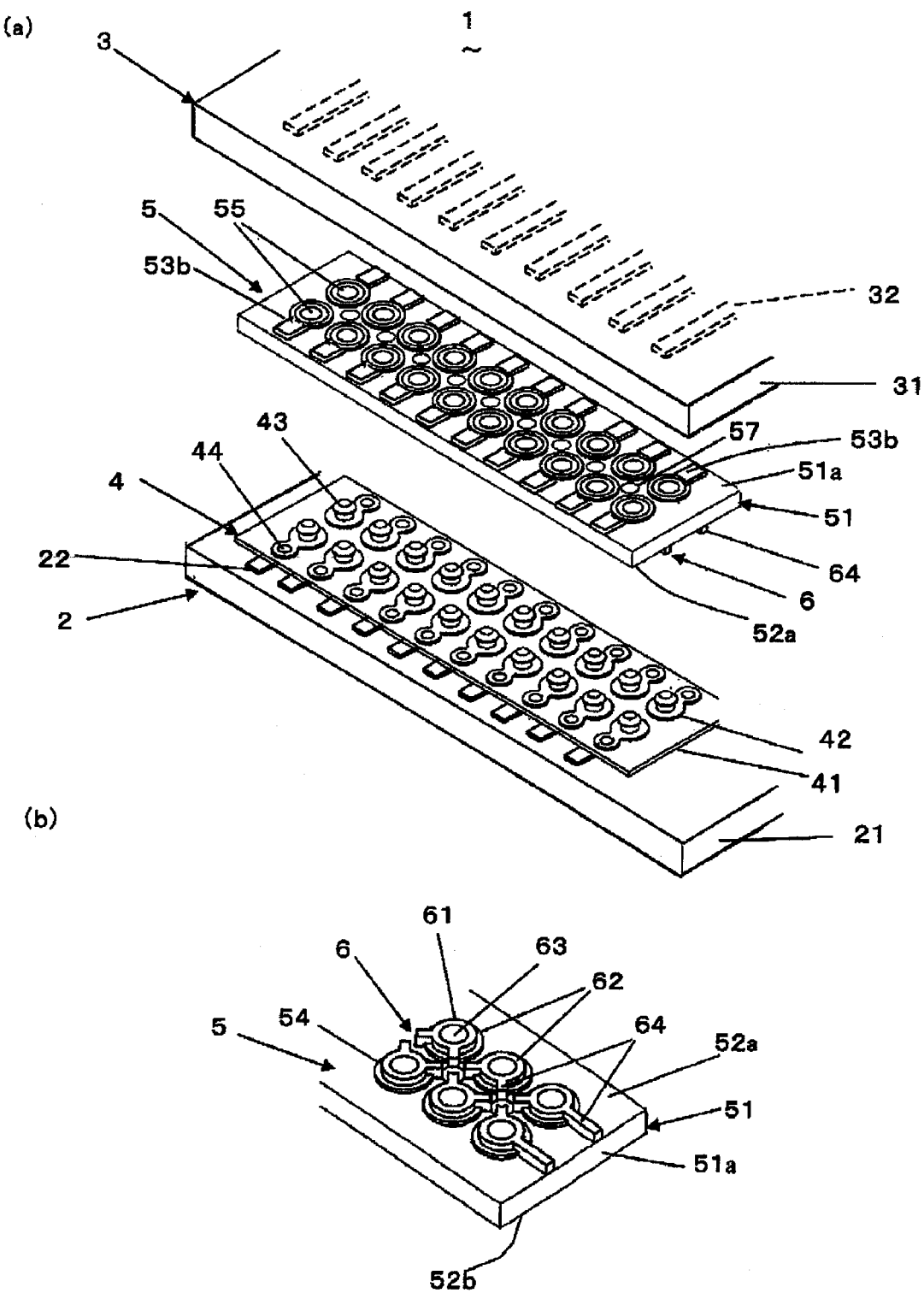
FIG. 11(a) is an exploded view of a board-to-board connector in accordance with Third embodiment of the present invention.
FIG. 11(b) is a partial perspective view of the second connector in the board-to-board connector when viewed from the direction of connecting the second connector to the first connector.

As shown in FIG. 7, the substrate 51a has a thickness d1. To fill the conductive rubber 6 forming a conductive pattern 61 described below (refer to FIG. 9) for integration, the substrate 51a has the through hole 55 having a diameter $\phi 2a$ capable of inserting the elastic conductive section 62 of the conductive pattern 61 and a gate line 64 (hereinafter referred to a gate) connecting the elastic conductive sections 62 to each other, respectively, thereinto, the gate groove 56 and a separation hole 57 for separating the gate 64. The through hole 55 has a narrower portion having a diameter $\phi 2b$ at the center of the substrate 51a and a protruded section 55b is formed along the circumference of the narrower portion. The protruded section 55b is formed so as to be fitted into and engaged with a dented section 62b formed on the outer wall surface of the elastic conductive section 62. The thickness d1 of the substrate 51a is set to be substantially equal to a thickness d4 of the elastic conductive section 62 and a depth d2 of the gate groove 56 is set to be substantially equal to a thickness d3 of the filled gate 64. Thus, the conductive pattern 61 of the conductive rubber 6 can be filled into the through hole 55 and the gate groove 56.

As shown in FIG. 9, the conductive pattern 61 of the conductive rubber 6 has a plurality of cylindrical elastic conductive sections 62 each having a through hole 63 for inserting the bump 43 at the position corresponding to the bump 43 and the connection gate 64 temporarily provided as a matter of manufacturing for connecting the elastic conductive sections 62 to each other. The gate 64 is cut after being filled into the substrate 51a to form an electrically independent circuit in the conductive pattern 61. The outer diameter $\phi 3a$ of the elastic conductive section 62 is almost equal to the diameter $\phi 2a$ of the through hole 55 at the inlet side of the filled substrate 51a. The elastic conductive section 62 has the dented section 62b at the center thereof in the thickness direction and the outer diameter of the wall of the dented section 62b is set to be a diameter $\phi 3c$ smaller than the diameter $\phi 3a$. When the elastic conductive section 62 is filled into the substrate 51a, the dented section 62b is fitted into and engaged with the protruded section 55b on the circumference of the through hole 55 on the substrate 51a. A diameter $\phi 3b$ of the through hole 63 on the elastic conductive section 62, into which the bump 43 is inserted, is formed to be smaller than the diameter $\phi 1a$ of the umbrella section 43a of the bump 43 (refer to FIG. 3). The diameter $\phi 3b$ of the through hole 63 is almost equal to the diameter $\phi 1b$ of the neck section 43b of the bump 43.

As shown in FIGS. 8(a), 8(b) and 8(c), in the connector 5 having the elastic substrate 51 formed of the substrate 51a and the conductive rubber 6, the elastic conductive section 62 and the gate 64 of the conductive pattern 61 are filled into the through hole 55 and the gate groove 56 on the substrate 51a, respectively, to form the integrally molded conductive pattern 61. Thus, there is no need to provide a circuit pattern for contacting against the bump 43 on the substrate 51a by means of plating.

Next, the circuit boards 2, 3 in the case where the bump 43 is inserted into the elastic conductive section 62 will be described with reference to FIGS. 10(a), 10(b). As described above, the first connector 4 having the bump 43 is fixed to the circuit board 2 so as to be electrically connected to the circuit pattern 22 of the circuit board 2 through the connection pattern 45 on the back surface side of the bump 43. The second connector 5 having the elastic conductive section 62 of the conductive rubber 6 is fixed to the circuit board 3 in the state where the elastic conductive section 62 is electrically connected to the circuit pattern 32 of the circuit board 3.

The connector 4 is connected to the connector 5 by inserting the bump 43 into the elastic conductive section 62. As the bump 43 is inserted into the through hole 63 on the elastic conductive section 62, since the diameter $\phi 1a$ is larger than the diameter $\phi 3b$ of the through hole 63, the umbrella section 43a of the bump 43 expands the side wall surface 63a of the through hole 63 on the elastic conductive section 62 in the radial direction. Since the umbrella section 43a is set so as to go forward up to the middle of the depth of the through hole 63. Thus, in the state where the bump 43 is completely inserted into the elastic conductive section 62, the umbrella section 43a is located at the center of the through hole 63 and puts pressure to the side wall 62a near the center in the radial direction, thereby pressing the side wall 62a toward the protruded section 55b of the through hole 55 on the substrate 51.

At this time, since the elastic conductive section 62 is an elastic body made of the conductive rubber 6, a contact portion 62c with the umbrella section 43a is elastically deformed and dented. The diameter $\phi 1b$ of the neck section 43b of the bump 43 is almost equal to the diameter $\phi 3b$ of the through hole 63. Thus, since the side wall 62a is hardly pressed, the side wall 62a of the elastic conductive section 62 as a portion into which the neck section 43b is inserted is not deformed. Since elastic deformation in the elastic conductive section 62 occurs only at the umbrella section 43a of the bump 43, the bump 43 is caught in the elastic conductive section 62 and engaged with the elastic conductive section 62. In this manner, the connector 4 is connected to the connector 5, thereby achieving electrical and mechanical connection between the circuit boards 2, 3.

According to this embodiment thus constituted, since the conductive pattern 61 of the conductive rubber 6 in the substrate 51a and the through hole 55 is electrically connected to the bump 43, there is no need to form a circuit pattern for contacting against the bump on the substrate 51a by means of plating or the like as well as a conductive pattern using a copper foil or the like. Moreover, the through hole 63 of the conductive rubber 6 enables both electrical and mechanical connection, thereby achieving simple manufacturing. Since the bump 43 is inserted into the through hole 63 of the conductive rubber 6, compared with the case the bump 43 contacts against the through hole made of a copper foil, there is less possibility that the conductive pattern 61 is chipped or peeled off due to insertion of the umbrella section 43a of the bump 43 into the through hole. Furthermore, the through hole 63 can be configured using the conductive rubber 6 only at the area of the substrate with circuit 51a of the elastic substrate 51 into which the bump is inserted. Thus, since the whole of the substrate with circuit 51a need not be elastic, an inexpensive circuit board can be used, resulting in lower costs.

Next, a board-to-board connector in accordance with Third embodiment of the present invention will be described with reference to FIG. 11 to FIG. 14. The board-to-board connector 1 in this embodiment has the same basic structure as the board-to-board connector in Second embodiment. Third embodiment is different from Second embodiment in the following points: In the second connector 5, the gate groove 56 is not formed on the substrate with circuit 51a of the elastic substrate 51 and the conductive rubber 6 is integrally formed on the substrate 51a and in the through hole. Since the first connector 4 in this embodiment is the same as the connector 4 in First embodiment, detailed description thereof is omitted.

Figure 13:
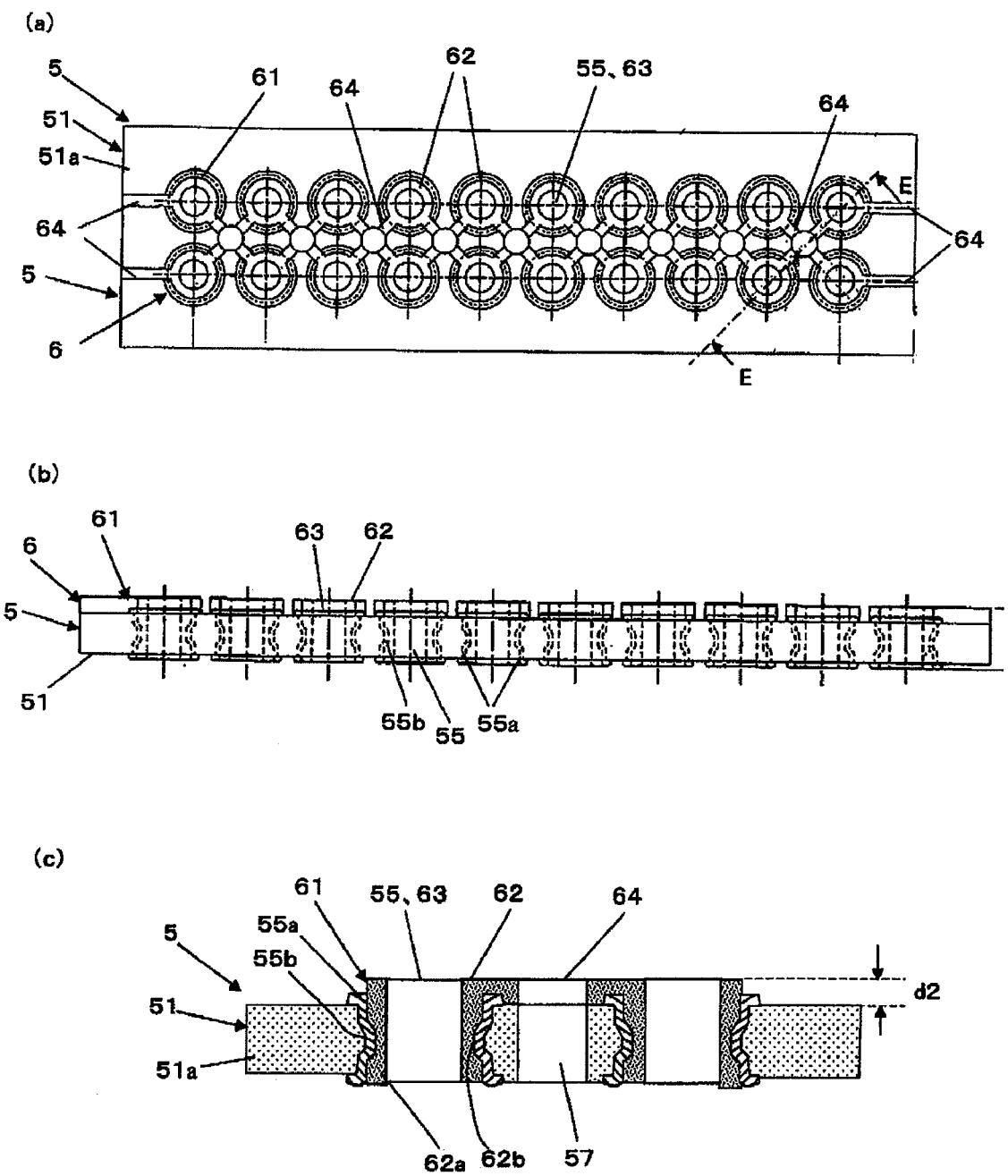
FIG. 13(a) is a plan view of the second connector in the board-to-board connector.
FIG. 13(b) is a side view of FIG. 13(a).
FIG. 13(c) is a sectional view taken along E-E in FIG. 13(a).
Figure 14:
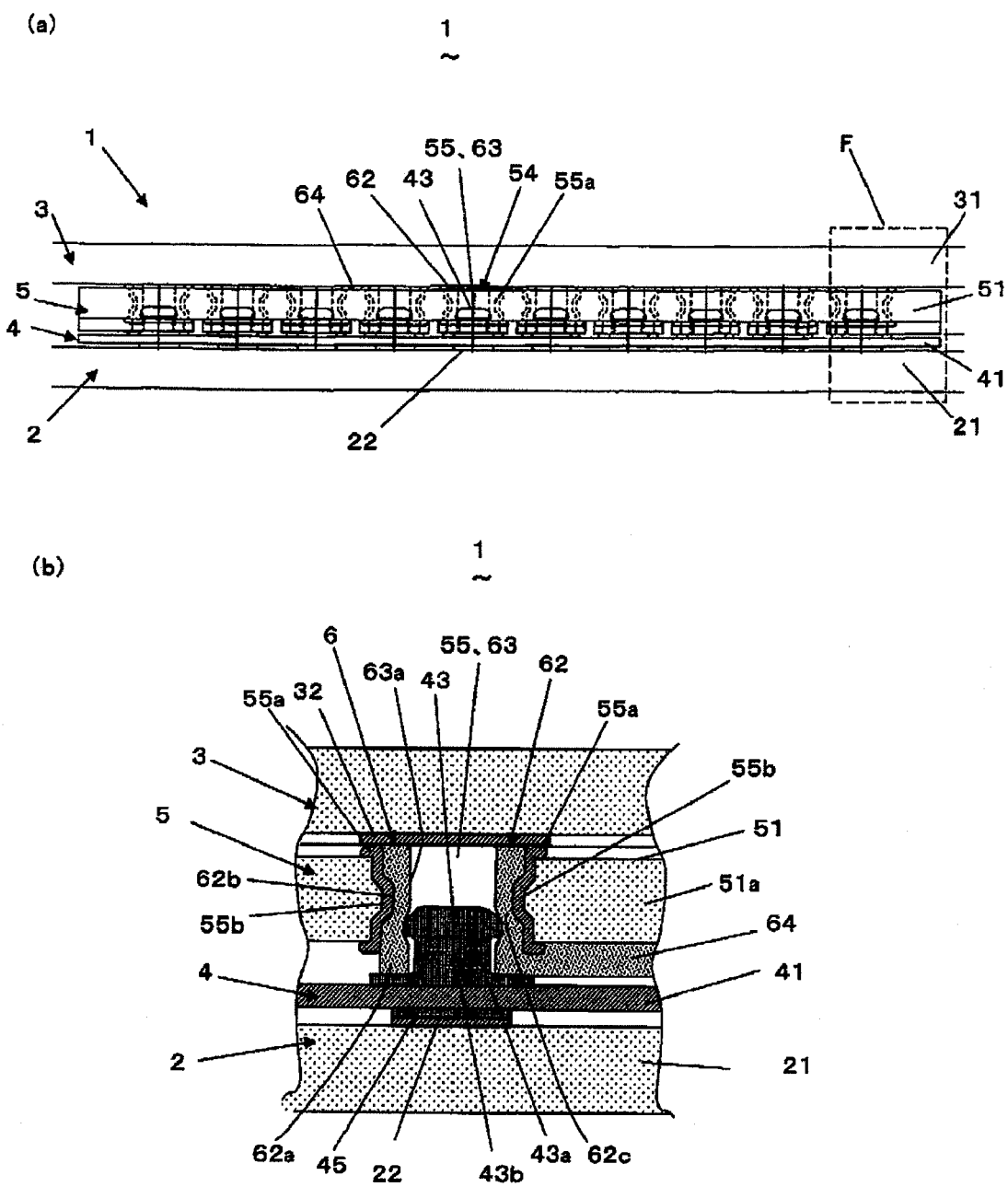
FIG. 14(a) is a sectional view showing connection state of the board-to-board connector.
FIG. 14(b) is an enlarged view of a part F in FIG. 14(a).
Figure 15:
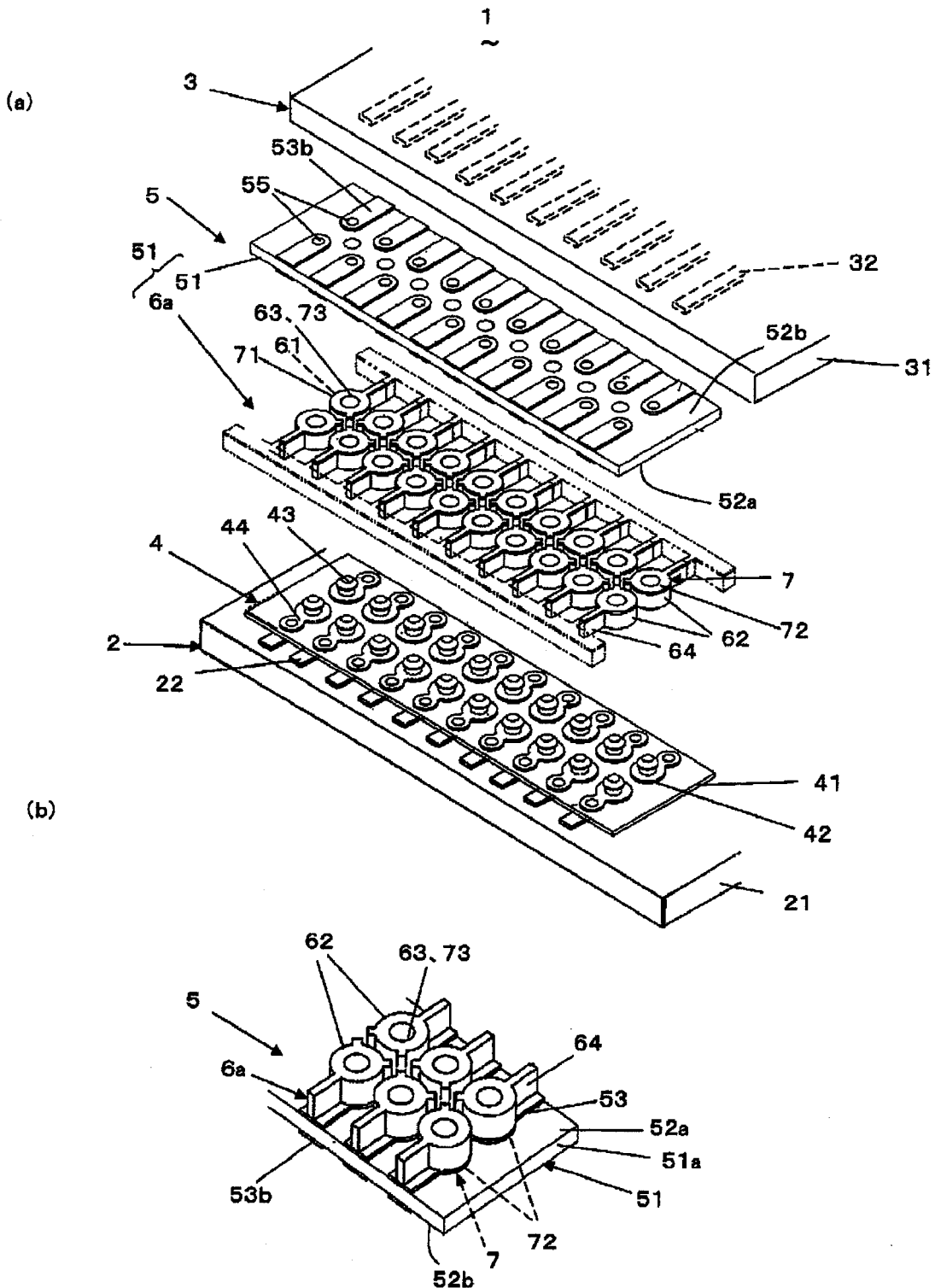
FIG. 15(a) is an exploded view of a board-to-board connector in accordance with Fourth embodiment of the present invention.
FIG. 15(b) is a partial perspective view of the second connector in the board-to-board connector when viewed from the direction of connecting the second connector to the first connector.

As shown in FIG. 13, the elastic substrate 51 of the second connector 5 has no gate groove 56 in Second embodiment (refer to FIG. 7) and includes the substrate 51a having the through hole 55 and the separation hole 57 and the conductive pattern 61 forming the elastic conductive section 62 by using the conductive rubber 6 in Second embodiment. The elastic substrate 51 and the conductive rubber 6 are integrally molded by inserting the elastic conductive section 62 of the conductive pattern 61 into the through hole 55 of the substrate 51a. Thus, the connector 5 in this embodiment is basically the same as the connector 5 in the above-mentioned embodiments, and is different from that in Second embodiment in that the gate 64 of the conductive pattern 61 is formed on the substrate 51a.

Figure 12:
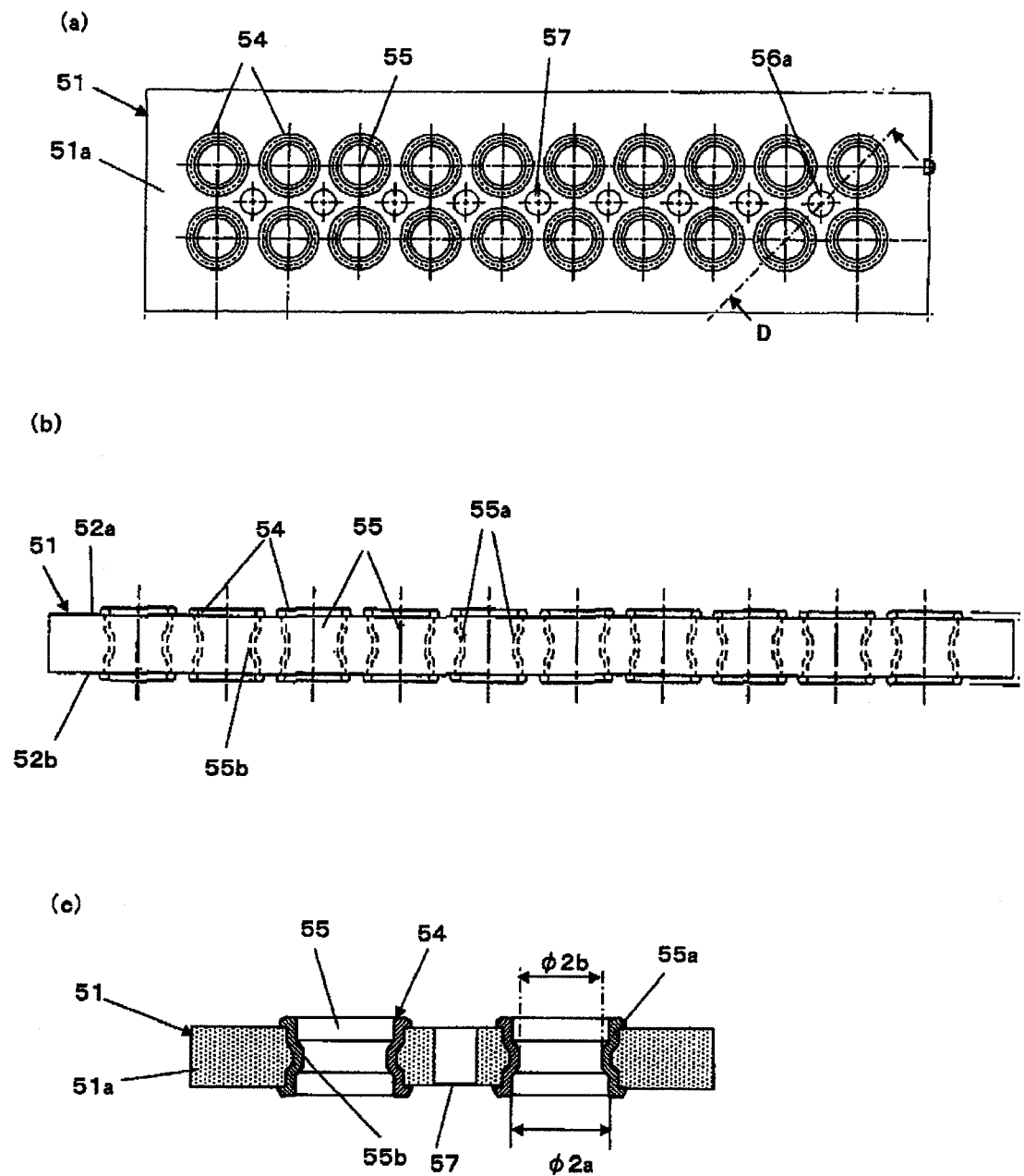
FIG. 12(a) is a plan view of the first connector in the board-to-board connector.
FIG. 12(b) is a side view of FIG. 12(a).
FIG. 12(c) is a sectional view taken along D-D in FIG. 12(a).

As shown in FIG. 12, a through hole 55 made of copper foil is formed on the substrate 51a and the protruded section 55b is provided in the middle of the through hole 55 in the depth direction. FIG. 12 is the same as FIG. 7 except that no gate groove 56 is formed (refer to FIG. 8). By attaching the conductive pattern 61 of the conductive rubber 6 as shown in FIG. 9 to the substrate 51 and filling the elastic conductive section 62 into the through hole 55, as shown in FIG. 13, the substrate 51a is integrated with the conductive rubber 6 in the state where the gate 64 protrudes from the surface of the substrate 51a by a height d2.

Next, the circuit boards 2, 3 in the state where the bump 43 is inserted into the elastic conductive section 62 will be described with reference to FIGS. 14(a), 14(b). As described above, the first connector 4 having the bump 43 is fixed to the circuit board 2 so as to be electrically connected to the circuit pattern 22 of the circuit board 2 through the connection pattern 45 on the back surface side of the bump 43. The second connector 5 having the elastic conductive section 62 of the conductive rubber 6 is fixed to the circuit board 3 in the state where the elastic conductive section 62 is electrically connected to the circuit pattern 32 of the circuit board 3.

The connector 4 is connected to the connector 5 by inserting the bump 43 into the elastic conductive section 62 of the connector 5. This connection is the same as the connection in Second embodiment except that the elastic conductive section 62 protrudes from the surface of the substrate 51a on the connection plane of the connector 5 by the height d2 of the gate 64, detailed description thereof is omitted.

As described above, according to this embodiment, since the conductive pattern is integrally formed on the substrate 51 and in the through hole 55 without forming a groove on the circuit board, manufacturing processes become simple, leading to reduction in manufacturing costs. Further, groove processing of further decreasing the intensity of the thin substrate having low intensity is not carried out, the intensity of the connector can be prevented from lowering. Furthermore, since the conductive rubber 6 protrudes from the surface of the substrate 51 by the height of the gate 64 of the conductive pattern 61, at contact between the surfaces of the connector 4 and the connector 5, the substrates can be brought into closer contact with each other due to elasticity. Mechanically speaking, due to the shock absorption effect, it is possible to prevent the connector from being destroyed by surface contact pressure.

Next, a board-to-board connector in accordance with Fourth embodiment of the present invention will be described with reference to FIG. 15 to FIG. 19. The board-to-board connector 1 in this embodiment has the same basic structure as that in Third embodiment. The board-to-board connector 1 has the elastic substrate 51 including an insulative substrate with circuit 51a and a conductive rubber sheet 6a which is joined to the substrate 51a and forms the through hole 63 into which the bump 43 is inserted thereon, and serves to perform board-to-board connection by inserting the bump 43 into the through hole 63 of the conductive rubber sheet 6a. Since the first connector 4 in this embodiment is the same as the connector 4 in First embodiment, detailed description thereof is omitted.

Figure 16:
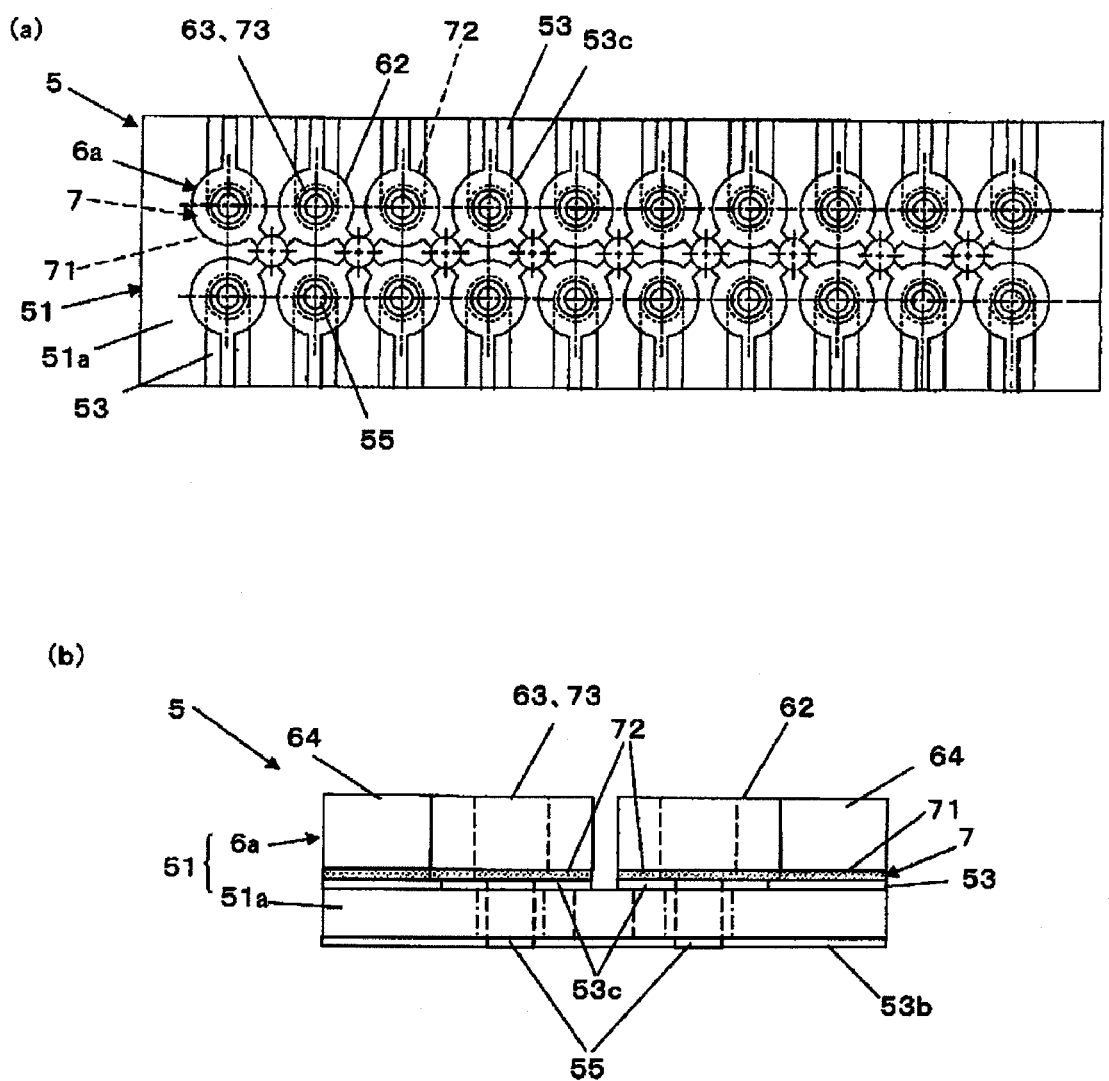
FIG. 16(a) is a plan view of the second connector in the board-to-board connector.
FIG. 16(b) is a side view in FIG. 16(a).
Figure 17:
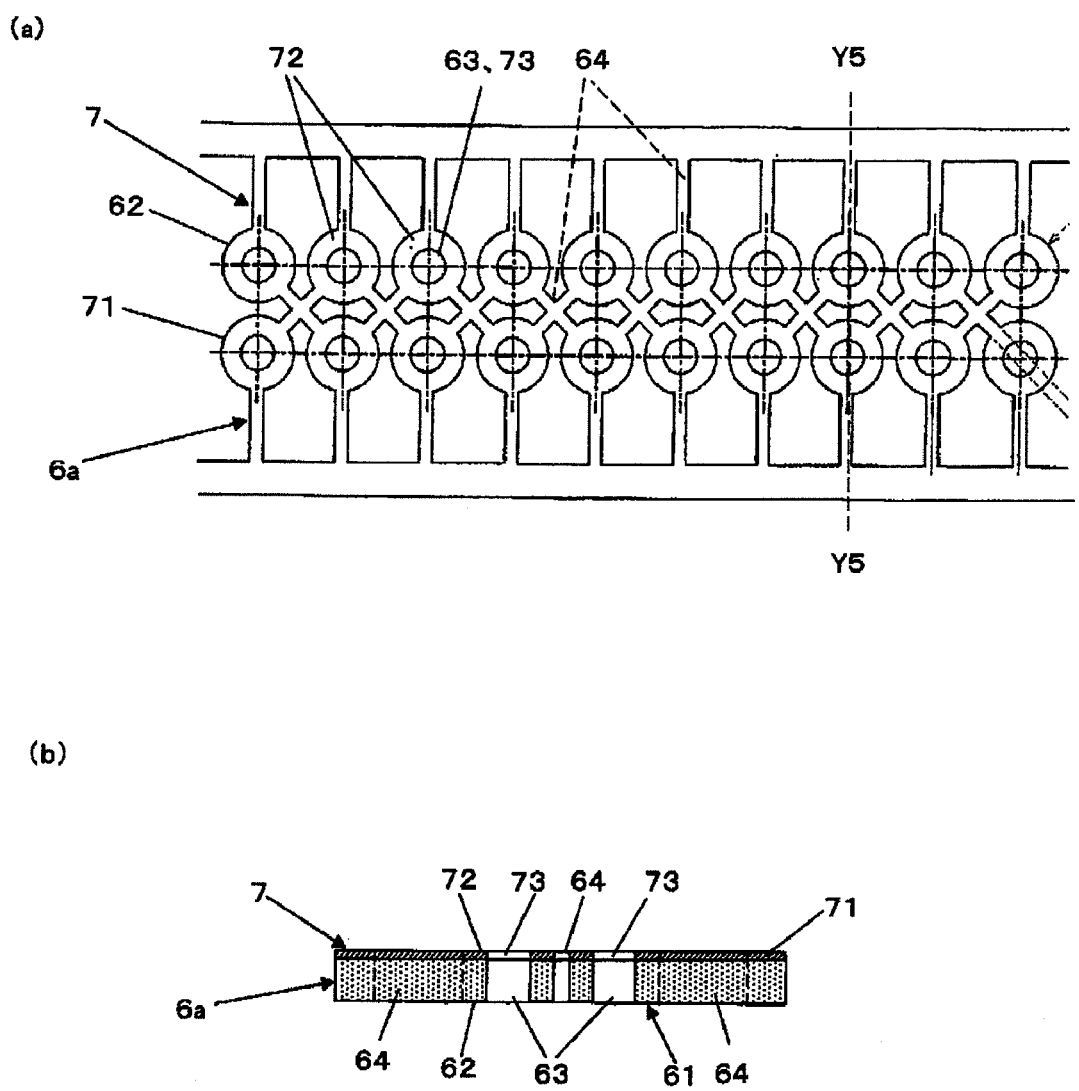
FIG. 17(a) is a plan view of a conductive rubber sheet with copper foil in the second connector.
FIG. 17(b) is a sectional view taken along Y5-Y5 in FIG. 17(a).

In the second connector 5, the elastic substrate 51, as shown in FIG. 16, FIG. 17, comprises the insulative substrate 51a having a circuit pattern (conductive pattern) connected to each surface thereof through the through hole 55 and the conductive rubber sheet 6a obtained by making the conductive rubber 6 in the shape of a sheet. A copper foil 7 is stuck on the surface of the conductive rubber sheet 6a and a copper foil pattern 71 of the copper foil 7 is integrated with the conductive pattern 61 of the conductive rubber sheet 6a. The elastic conductive section 62 having the through hole 63 into which the bump 43 of the first connector 4 is inserted is formed on the conductive rubber sheet 6a. The through hole 73 corresponding to the through hole 63 of the conductive pattern 61 is provided on the copper foil pattern 71. A land pattern 72 joined to the circuit conductive pattern 53 of the substrate 51a is provided on the copper foil pattern 71 surrounding the through hole 73. The land pattern 72 has the substantially same as a below-mentioned land pattern 53c provided on the periphery of the through hole 55 of the conductive pattern 53 on the surface 52a of the substrate 51a in FIG. 18. The land pattern 72 is joined to the land pattern 53c by means of soldering or the like and the conductive rubber sheet 6a is electrically joined and fixed to the substrate 51a. Thereby, the connector 5 can be connected to the connector 4 by inserting the bump 43 into the elastic conductive section for bump insertion 62 formed on the conductive pattern 61 of the conductive rubber sheet 6a. Since the conductive rubber sheet 6a has the same structure as the conductive rubber 6 in Third embodiment shown in FIG. 9, drawing and detailed description thereof are omitted.

Figure 18:
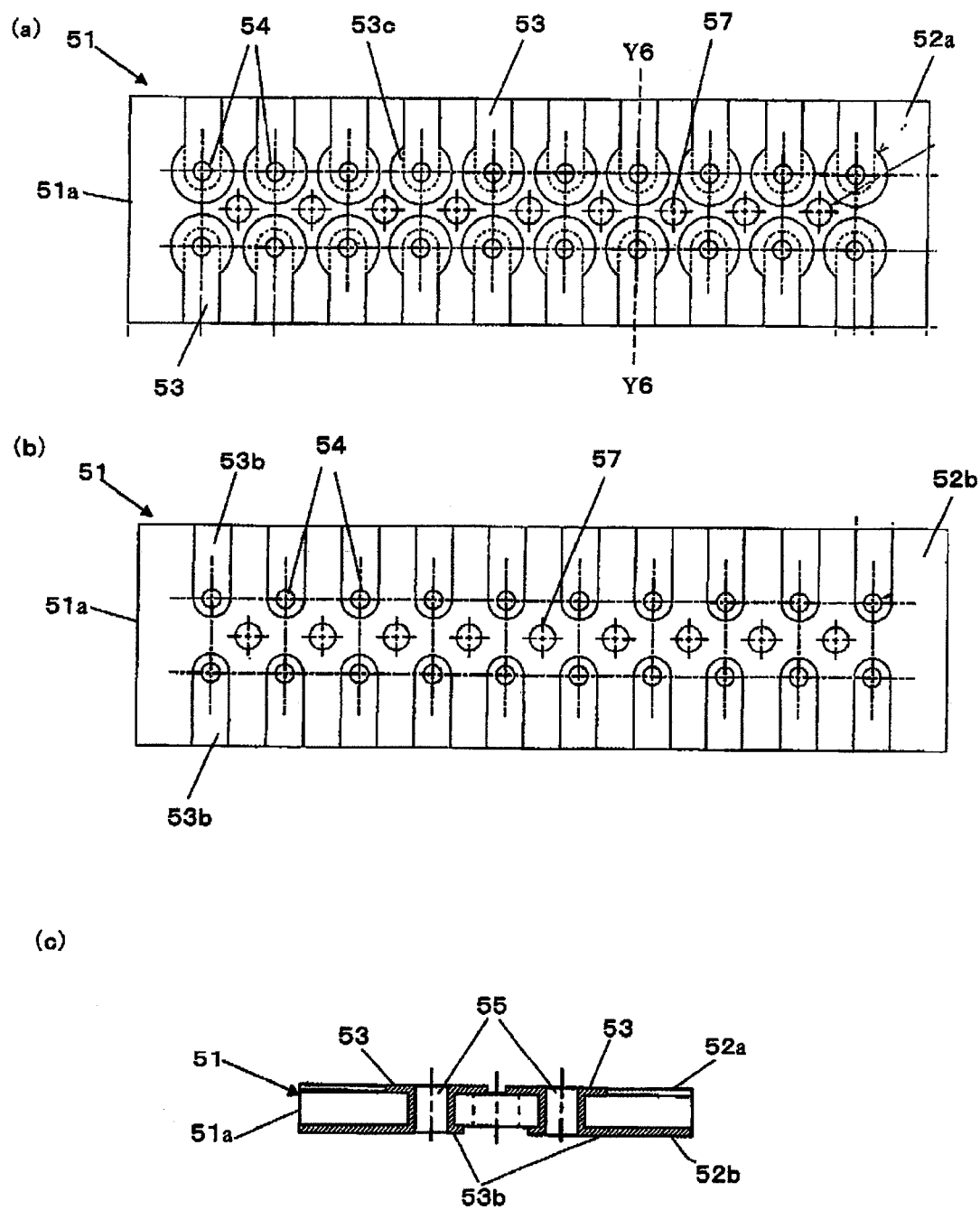
FIG. 18(a) is a plan view showing a front surface side of a substrate connected to the second connector.
FIG. 18(b) is a plan view of a back surface side of FIG. 18(a).
FIG. 18(c) is a sectional view taken along Y6-Y6 in FIG. 18(a).
Figure 19:
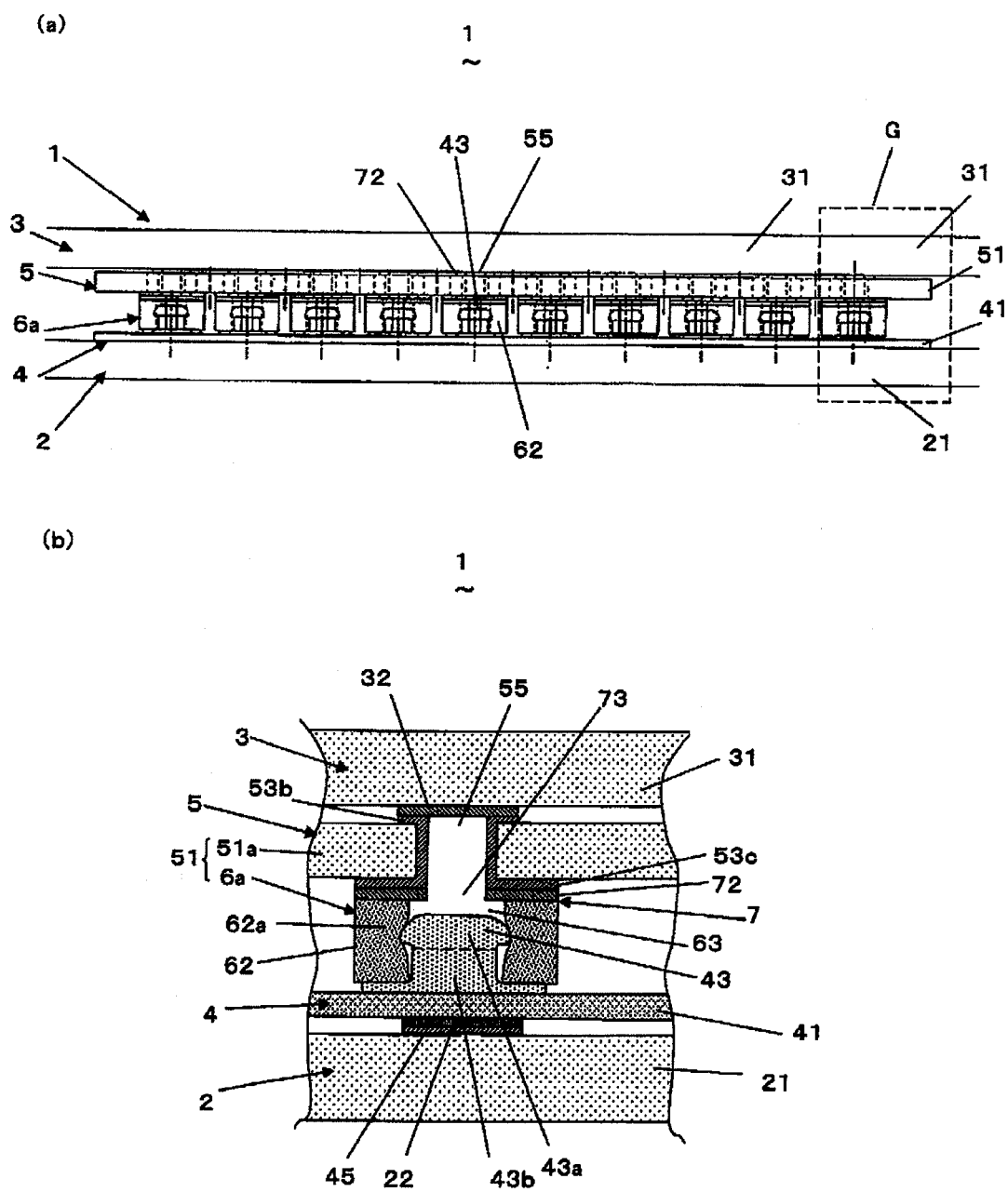
FIG. 19(a) is a sectional view showing connection state of the board-to-board connector.
FIG. 19(b) is an enlarged view of a part G in FIG. 19(a).

The substrate 51a joined to the conductive rubber sheet 6a, as shown in FIG. 18, has the surface 52a joined to the conductive rubber sheet 6a and conductive patterns 53, 53b located at substantially symmetrical positions with each other on a back surface 52b joined to the circuit board 3. These circuit patterns are electrically connected via the through holes 55 on the circuit patterns. The conductive pattern 53b of the substrate 51a is jointed to the circuit pattern 32 of the circuit board 3 by means of soldering. Thus, the substrate 51a joined to the conductive rubber sheet 6a is electrically connected and fixed to the circuit board 3.

Next, the circuit boards 2, 3 in the state where the bump 43 is inserted into the elastic conductive section 62 will be described with reference to FIGS. 19(a), 19(b). As described above, the first connector 4 is fixed to the circuit board 2 so as to be electrically connected to the circuit pattern 22 of the circuit board 2 through the connection pattern 45 on the back surface side of the bump 43. The second connector 5 is fixed to the circuit board 3 in the state where the elastic conductive section 62 is electrically connected to the circuit pattern 32 of the circuit board 3.

The connector 4 is connected to the connector 5 by inserting the bump 43 into the elastic conductive section 62 of the conductive pattern 61 on the conductive rubber sheet 6a of the connector 5 as described above. Since this connection is the same as the connection in Third embodiment, detailed description thereof is omitted.

As described above, according to this embodiment, since the conductive rubber sheet 6a and the substrate 51a in the elastic substrate 5 are not integrally molded and the conductive rubber sheet 6a which is separate from the substrate 51a is used, expensive facilities and complicated techniques for integral molding are unnecessary. Since the copper foil 7 is formed on the surface of the conductive rubber sheet 6a, the conductive rubber sheet 6a can be easily joined to the substrate 51a by using the copper foil 7. Moreover, when the elastic conductive section 62 is attached to the substrate 51a, first, an unnecessary portion is removed from the conductive rubber sheet with copper foil 6a by means of mechanical processing and the molded conductive rubber sheet with copper foil 6a is joined to the substrate 51a through the copper foil 7, and then, an unnecessary pattern and so on are mechanically removed from the substrate with the rubber sheet again. In this manner, the necessary conductive rubber pattern can be processed and formed on the substrate 51a.

Although preferred embodiments of the present invention have been described, the present invention is not limited to the above-mentioned embodiments and various modification can be applied to the above-mentioned embodiments so as not to deviate from the scope of the present invention. Although the elastic body or the conductive rubber sheet is used only in the conductive pattern of the second connector 5 in this embodiment, it can be also applied to the first connector 4. Any material having elasticity other than conductive rubber may be used as the elastic body. This application is based on Japanese Patent Application No. 2006-18293 and contents of the application are incorporated herein by reference.

The invention claimed is:

1. A board-to-board connector for connecting circuit boards to each other comprising:
   a first connector attached to one circuit board; and
   a second connector attached to the other circuit board, wherein
   the first connector includes a substrate of an insulative member having an umbrella-like conductive bump electrically connected to a circuit of the one circuit board,
   the second connector includes a conductive pattern electrically connected to the other circuit board and an elastic substrate which is electrically connected to the conductive pattern and has an insertion hole capable of inserting the bump thereinto, and
   both the circuit boards are electrically and mechanically connected to each other by inserting the bump into the insertion hole of the elastic substrate.

2. The board-to-board connector as stated in claim 1, wherein
   the elastic substrate is formed of a substrate with circuit and a conductive rubber filled into a groove and a through hole which are formed on the substrate with circuit to be integrally molded, and
   the conductive pattern is formed of a circuit of the substrate and the conductive rubber.

3. The board-to-board connector as stated in claim 1, wherein
   the elastic substrate is formed of a substrate with circuit and a conductive rubber integrally molded on the substrate with circuit and in a through hole formed on the substrate, and
   the conductive pattern is formed of a circuit of the substrate and the conductive rubber.

4. The board-to-board connector as stated in claim 1, wherein
   the elastic substrate is formed of a insulative substrate with circuit and a conductive rubber sheet which is joined to the substrate and on which a hole for inserting the bump thereinto is formed, and
   the conductive pattern is formed of a circuit of the substrate and the conductive rubber sheet.

5. The board-to-board connector as stated in claim 4, wherein
   the conductive rubber sheet has a copper foil and the copper foil is joined to a joining pattern provided on the insulative substrate with circuit.

* * * * *